United States Patent [19]

Kamioka

[11] 4,333,774
[45] Jun. 8, 1982

[54] METHOD FOR PRODUCING WALLED EMITTER TYPE BIPOLAR TRANSISTORS

[75] Inventor: Hajime Kamioka, Yokohama, Japan

[73] Assignee: Fujitsu Limited, Kawasaki, Japan

[21] Appl. No.: 130,535

[22] Filed: Mar. 14, 1980

[30] Foreign Application Priority Data

Mar. 20, 1979 [JP] Japan .................................. 54/33113

[51] Int. Cl.³ .................... H01L 21/26; H01L 21/225
[52] U.S. Cl. ....................................... 148/1.5; 29/571; 148/187; 357/34; 357/50
[58] Field of Search .................. 148/1.5, 187; 29/571; 357/34, 50

[56] References Cited

U.S. PATENT DOCUMENTS

| | | | |
|---|---|---|---|
| 4,110,779 | 8/1978 | Rathbone et al. | 357/34 |
| 4,143,455 | 3/1979 | Schwabe et al. | 29/571 |
| 4,175,983 | 11/1979 | Schwabe | 148/1.5 |
| 4,184,172 | 1/1980 | Raffel et al. | 357/50 |
| 4,191,595 | 3/1980 | Aomura et al. | 148/1.5 |
| 4,199,378 | 4/1980 | Van Gils | 148/1.5 |
| 4,199,380 | 4/1980 | Farrell et al. | 148/1.5 |

OTHER PUBLICATIONS

Wilson, P. R., Solid St. Electronics, 17 (1974) 465.
Jambotkar, G. G., IBM-TDB, 19 (1977) 4598.

*Primary Examiner*—Upendra Roy

[57] ABSTRACT

A base region of a walled emitter type bipolar transistor is formed by an ion implantation process. During the ion implantation, insulating films are disposed on a part of a semiconductor body corresponding to an emitter region, so that the obtained profile of a base-collector junction is terraced, namely, a part of the base-collector junction which is below the insulating films is shallower than the rest of the base-collector junction.

18 Claims, 46 Drawing Figures

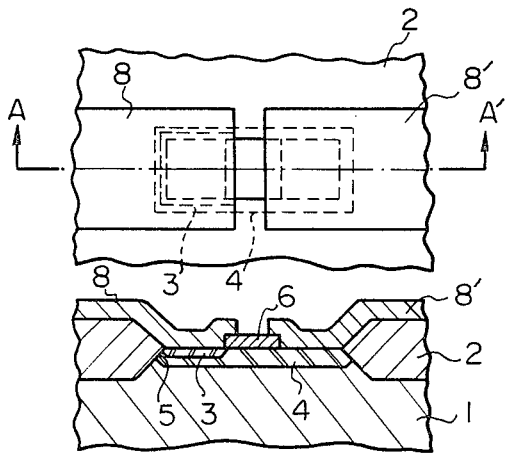
Fig. 1A PRIOR ART
Fig. 1B PRIOR ART
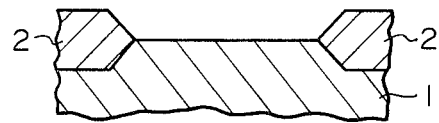
Fig. 2A PRIOR ART
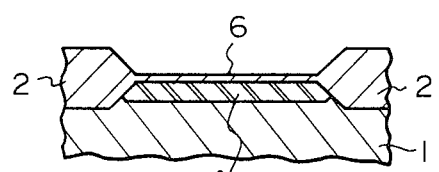
Fig. 2B PRIOR ART
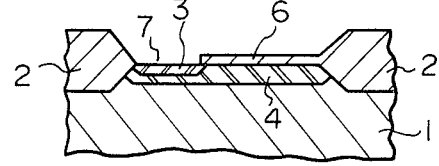
Fig. 2C PRIOR ART

METHOD FOR PRODUCING WALLED EMITTER TYPE BIPOLAR TRANSISTORS

BACKGROUND OF THE INVENTION

1. Field of the Invention

The present invention relates to a method for producing bipolar transistors which are isolated from each other and from other elements by an insulating layer and which have emitter regions that are in contact with the insulating layer, and further relates to bipolar transistors produced by such a method.

2. Description of the Prior Art

A bipolar transistor is used as an element of a semiconductor device, e.g. IC or LSI. As such a bipolar transistor, there is known a so-called "walled emitter type bipolar transistor," illustrated in FIGS. 1A and 1B. FIG. 1B is a sectional view taken along line A—A' of FIG. 1A. This type of transistor is isolated by a field insulating layer 2, which comprises silicon dioxide ($SiO_2$) and is formed on a semiconductor body 1, and has an emitter region 3 which is in contact with the field insulating layer 2 and lies within a base region 4. A portion of the field insulating layer 2 encroaches on the semiconductor body 1 to demarcate an area for an element, e.g. a transistor. In this case, the collector region of the transistor is the semiconductor body 1, and is connected to a collector electrode (not illustrated in FIGS. 1A and 1B). The transistor is provided with an emitter electrode 8, a base electrode 8', and an insulating layer 6.

The above-mentioned bipolar transistor is produced in the following manner. The starting material is the semiconductor body 1 (FIG. 2A) of a first conductivity type (e.g. n-type), consisting of a single-crystalline silicon substrate and a silicon epitaxial layer grown on the substrate. In case of a bipolar integrated circuit device, the conductivity type of the substrate is generally p-type, and that of the epitaxial layer formed on the substrate is n-type. Circuit elements, e.g. bipolar transistors or resistors, of the integrated circuit device are formed in the epitaxial layer. Furthermore, isolation of the elements from each other is performed by forming an insulating material, a p-type region, or a V-groove, which extends from the surface of the epitaxial layer to the substrate. If desired, prior to the growth of the epitaxial layer, a so-called buried collector layer (n+-type) is formed in the usual manner. The semiconductor body 1 is selectively oxidized to form a field insulating oxide ($SiO_2$) layer 2 (FIG. 2A), isolating elements of the semiconductor device from each other. Impurities of a second conductivity type opposite to the first conductivity type (e.g. boron ions of p-type) are introduced into the semiconductor body 1 by an impurity diffusion process to form a base region 4 (FIG. 2B). The surface of the semiconductor body 1 is oxidized simultaneously or after the impurity diffusion to form an insulating layer, i.e. a silicon dioxide ($SiO_2$) layer 6 (FIG. 2B). Then, the silicon dioxide layer 6 is selectively etched by a conventional photo-etching process to open a hole 7 (FIG. 2C) of which a part of the side is formed by the insulating layer 2. It is preferable to etch the end part of the insulating layer 2 simultaneously with the etching of the silicon dioxide layer 6, as illustrated in FIG. 2C. Impurities of the first conductivity type, e.g. phosphorus ions, are introduced into the base region 4 of the semiconductor body 1 through the hole 7 to form an emitter region 3 (FIG. 2C) which is in contact with the insulating layer 2. Then, a hole for a base electrode is opened in the silicon dioxide layer 6 by a conventional photo-etching process. Finally, an emitter electrode 8 and a base electrode 8' made of metal, e.g. aluminum, are formed to produce the bipolar transistor, as illustrated in FIG. 1B. In this case, a collector electrode (not illustrated) is formed at a suitable position simultaneously with the formation of the emitter and base electrodes.

However, the above-mentioned bipolar transistor has problems, in that the breakdown voltage between the collector and the emitter is low, and a short-circuit between the collector and the emitter is occasionally generated. These problems are caused by formation of a channel having a conductivity type opposite to the conductivity type of the base region, e.g. an n-type channel, at an interface 5 (FIG. 1B) between the base region 4 and the insulating layer 2.

When impurities are introduced into a semiconductor body by a conventional impurity diffusion process, the concentration of impurities is the semiconductor body is highest at the surface thereof, and gradually decreases with an increase in the distance from the surface. It is well known by persons skilled in the art that an n-type channel can be induced in a p-type region adjoining a silicon dioxide layer, when the concentration of impurities of the p-type region is $10^{16} \sim 10^{17}$ atoms/cm$^3$. When a walled emitter type bipolar transistor is produced in the above-mentioned manner, the concentration of impurities of the base region 4 at the interface 5 (FIG. 1B) between the base region 4 and insulating layer 2 becomes $10^{16} \sim 10^{17}$ atoms/cm$^3$, so that the interface 5, i.e. the side surface of the base region 4, is easily changed to an n-type from a p-type. Namely, the n-type channel is easily formed at the side surface of the p-type base region 4.

SUMMARY OF THE INVENTION

It is an object of the present invention to substantially avoid the above-described problems of low breakdown voltage and the occurence of short-circuiting.

It is another object of the present invention to provide a method, for producing a walled emitter type bipolar transistor, which prevents a channelling from occurring at an interface between the base region and an insulating layer.

These and other objects are attained by providing an improved method for producing a bipolar transistor which is isolated from other elements by an insulating layer and which has an emitter region that is in contact with the insulating layer, wherein the improvement comprises the steps of: forming a first insulating film on a part of a semiconductor body and a part of the insulating layer prior to the formation of a base region; forming a second insulating film that is smaller than the first insulating film on the first insulating film above a part of the semiconductor body corresponding to the emitter region; and forming the base region by an ion implantation process.

A preferred embodiment of the method of production according to the present invention comprises the steps of: selectively forming the insulating layer on the semiconductor body of a first conductivity type; forming the first insulating film on a part of the semiconductor body and a part of the insulating layer; forming the second insulating film, which is smaller than the first film, on the first insulating film above a part of the semiconductor body corresponding to the emitter region; implanting impurities of a second conductivity type, opposite to the first conductivity type, into the semiconductor body by an ion implantation process to form a base region; removing the first and second insulating films; and introducing impurities of the first conductivity type into the part of the semiconductor body which is exposed by the removal of the first and second insulating films, to form the emitter region.

In another embodiment of the method of production, it is possible to form the first and second insulating films prior to the formation of the insulating layer and to use these films as an oxidation-resistant masking layer during the oxidation process which forms the insulating layer.

In the bipolar transistor produced by a method according to the present invention, the part of a base-collector junction which is under the side of the insulating layer which is in contact with the emitter region, is deeper than the part of the base-collector junction which is below the emitter region.

BRIEF DESCRIPTION OF THE DRAWINGS

FIG. 1A is a plan view of a walled emitter type bipolar transistor according to the prior art, FIG. 1B is a cross-sectional view taken along line A—A' of FIG. 1A, FIGS. 2A, 2B and 2C are cross-sectional views of the bipolar transistor of FIGS. 1A and 1B in intermediate stages of production in accordance with prior art techniques.

DETAILED DESCRIPTION OF THE INVENTION

Referring to FIGS. 3A through 3G, a process for production of a walled emitter type bipolar transistor in accordance with an embodiment of the present invention will now be explained. The starting material is a semiconductor body 1 consisting of a p-type silicon substrate and an n-type epitaxial layer grown on the substrate. It is possible to form an $n^+$-type buried layer (not illustrated) at a boundary portion between the substrate and the epitaxial layer by selectively introducing n-type impurities into the substrate and then growing the epitaxial layer.

Figure 3A:
FIGS. 3A through 3G are cross-sectional views of a walled emitter type bipolar transistor in stages of production in accordance with an embodiment of the method of production of the present invention.

The semiconductor body 1 is oxidized by a conventional selective oxidation process to form an insulating oxide ($SiO_2$) layer 2 to separate elements from each other, as illustrated in FIG. 3A. In the case where the formed insulating layer does not reach to the substrate due to a thin thickness of the insulating oxide layer, it is preferable to form a p-type isolation region, which extends from the bottom of the insulating oxide layer to the substrate, in the epitaxial layer by a conventional suitable process.

Figure 3B:
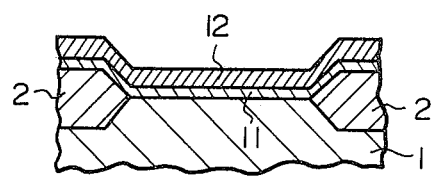

A first insulating film 11 comprising silicon nitride ($Si_3N_4$) and having a thickness of 30~100 nm, is formed on all the surfaces of the semiconductor body 1 and the insulating layer 2 by a conventional chemical vapour deposition (CVD) process, as illustrated in FIG. 3B. On the first insulating film 11, a second insulating film 12 (FIG. 3B), comprising silicon dioxide, phospho-silicate glass, boro-silicate glass, alumino-silicate glass or amorphous-silicate glass and having a thickness of 180~300 nm, is formed by the conventional chemical vapour deposition process. It is preferable to make the second insulating film of phospho-silicate glass, since the etching rate of the phospho-silicate glass is considerably higher than that of silicon nitride and silicon dioxide.

Figure 3C:
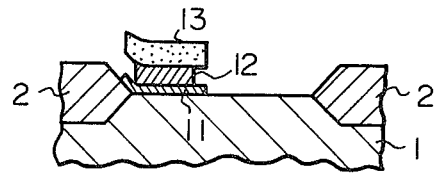

In order to etch the first and second insulating films 11 and 12 as illustrated in FIG. 3C, a photoresist film 13 is selectively formed on the second insulating film 12. The photoresist film 13 is located above a part of the insulating layer 2 and a part of the semiconductor body 1 corresponding to an emitter region. Since the photoresist film 13 serves as a mask during etching, the second and first insulating films 12 and 11 are selectively etched by a conventional etching process. It is possible to etch the second insulating film 12 to that it is smaller than the remaining first insulating film 11, as illustrated in FIG. 3C. It is preferable to carry out the etching steps in the following manner: both the second insulating film 12 of phospho-silicate glass and the first insulating film 11 of silicon nitride are first by etched by a plasma-etching process so that they are almost the same size, and then the second insulating film is slightly etched by a wet-etching using hydrofluoric acid (HF). After the etching step, the photoresist film 13 is removed.

Figure 3D:
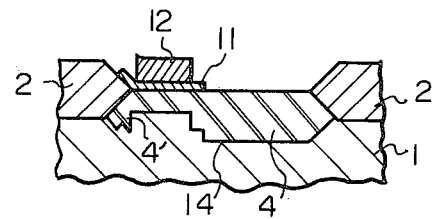

P-type impurities such as boron (B) ions are introduced into the semiconductor body 1 by a conventional ion implantation process to form a p-type base region 4, as illustrated in FIG. 3D. Because of the first and second insulating films 11 and 12 on the semiconductor body 1 and the insulating layer 2, the profile of a base-collector junction 14 is terraced, as illustrated in FIG. 3D. Namely, the part of the base-collector junction 14 which is below the first and second insulating films 11 and 12 is shallower than the rest of the base-collector junction 14. It is noteworthy that a part 4' (FIG. 3D) of the base region 4, lying under the side of the insulating oxide layer 2, is deeper than the part of the base region 4 under both the first and second insulating films 11 and 12.

Figure 3E:
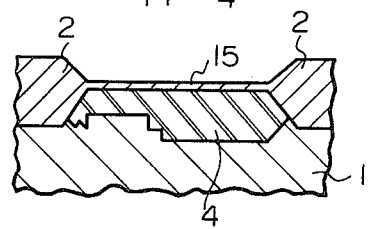

Then, the first and second insulating films 11 and 12 are removed from the surface of the semiconductor body 1 and the insulating layer 2. An annealing heat-treatment for the base region 4, i.e. the ion-implanted portion of the semiconductor body, is carried out. A third insulating film 15 comprising silicon dioxide is formed by oxidizing the semiconductor body 1 during the annealing treatment, as illustrated in FIG. 3E.

Figure 3F:
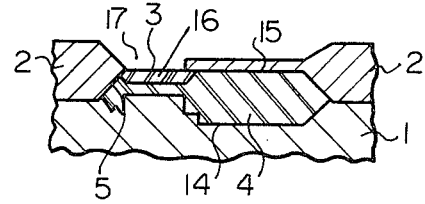

The third insulating film 15 is selectively etched by a conventional photo-etching process to open a hole 17 (FIG. 3F). A part of the side of the hole 17 is part of the insulating layer 2. N-type impurities such as phosphorus (P) ions are introduced into the semiconductor body 1 through the hole 17 by an ion implantation process or a diffusion process to form an emitter region 3 which is in contact with the insulating layer 2, as illustrated in FIG. 3F.

Figure 3G:
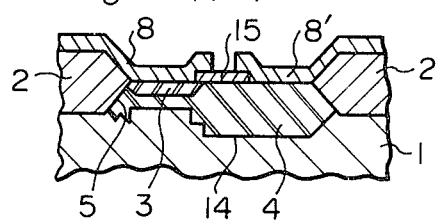

Another hole for a base electrode is opened in the third insulating film 15 by the photo-etching process and a conductor film, e.g. an aluminum film, is formed on all the surfaces of the semiconductor body 1, the insulating layer 2, and the third insulating film 15 by a conventional vapour evaporation process. Finally, the conductor film is selectively etched to form an emitter electrode 8, a base electrode 8', and a collector electrode (not illustrated), and thus a walled emitter type bipolar transistor is completed, as illustrated in FIG. 3G. It is possible to form the collector electrode on a part of the semiconductor body which is distant from the base region by a conventional suitable process. Furthermore, it is preferable to form an $n^+$-type collector contact region, under the collector electrode and above the $n^+$-type buried layer, within the semiconductor body.

It is possible to produce the walled emitter type bipolar transistor in accordance with another embodiment of the present invention. This process of production will now be explained, referring to FIGS. 4A through 4E. The starting material is the same semiconductor body 1 as that used in the previously explained embodiment. A first insulating film 21 consisting of a silicon dioxide film and a silicon nitride film is formed on the entire surface of the semiconductor body 1. The silicon dioxide film, having a thickness of 30~50 nm, is formed by oxidizing the semiconductor body 1, and serves as a buffer film which alleviates stress during heat-treatment. The silicon nitride film has a thickness of 50~100 nm and serves as an oxidation-resistant masking layer. Upon the first insulating film 21, a second insulating film 22, having a thickness of 180~300 nm and being of the same material as that used for the second insulating film 12 (FIG. 3B) in the above-explained embodiment, is formed.

Figure 4A:
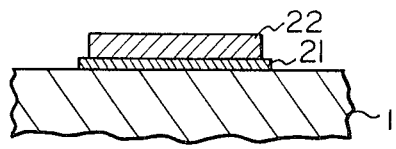
FIGS. 4A through 4G are cross-sectional views of a wall emitter type bipolar transistor in stages of production in accordance with another embodiment of the method of production of the present invention.

Both the first and second insulating films 21 and 22 are etched by a conventional plasma etching process or sputter etching process, and then only the second insulating film is slightly etched by a wet-etching using hydrofluoric acid, as illustrated in FIG. 4A.

Figure 4B:
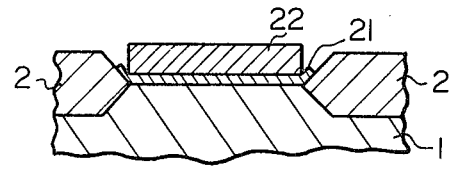

The semiconductor body 1 is selectively oxidized by a conventional high-pressure oxidation process to form an insulating layer 2, as illustrated in FIG. 4B. The temperature of the oxidation process should be lower than the melting point of the second insulating film.

Figure 4C:
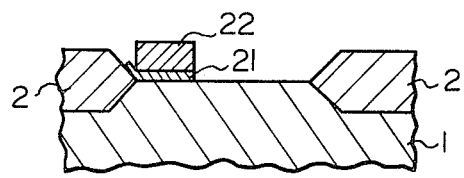

Then, both the first and second insulating films 21 and 22 are etched by a plasma etching or sputter etching process, as illustrated in FIG. 4C. The remaining portion of the first insulating film 21 is above a part of the insulating layer 2 and a part of the semiconductor body 1, and the remaining portion of the second insulating film 22 is above a part of the semiconductor body 1 corresponding to an emitter region.

Figure 4D:
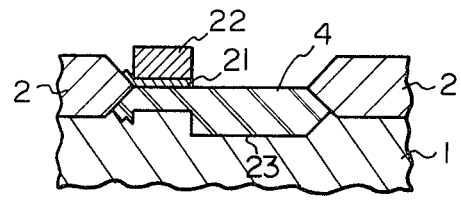

P-type impurities are introduced into the semiconductor body 1 by the conventional ion implantation process to form a p-type base region 4, as illustrated in FIG. 4D. The profile of a base-collector junction 23 is terraced like that illustrated in FIG. 3D.

Figure 4E:
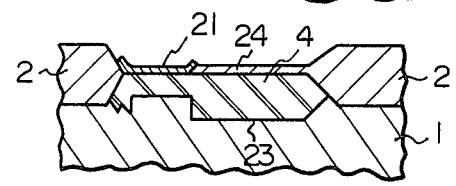

The remaining portion of the second insulating film 22 is removed from the first insulating film 21. The base region 4 is annealed, and simultaneously a third insulating ($SiO_2$) film 24 is formed by oxidizing the semiconductor body 1, as illustrated in FIG. 4E.

Figure 4F:
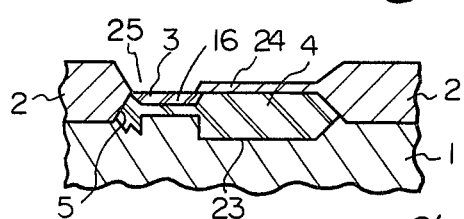

Then, the first insulating film 21 is removed by a conventional etching process to open a hole 25. N-type impurities are introduced into the semiconductor body 1 through the hole 25 by the diffusion process or the ion-implantation process to form an emitter region 3 that is in contact with the insulating layer 2, as illustrated in FIG. 4F.

Figure 4G:
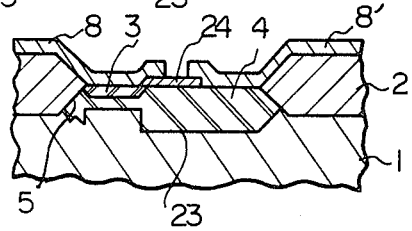

Another hole for a base electrode is opened in the third insulating film 24 by the photo-etching process. Finally, an emitter electrode 8, a base electrode 8' and a collector electrode (not illustrated) are formed to produce a walled emitter type bipolar transistor, as illustrated in FIG. 4G.

When the ion implantation for the base region is carried out, it is noted that the concentration of implanted impurities in the base region 4 at a level corresponding to an emitter-base junction 16 (FIGS. 3F and 4F) should be made larger than $10^{17}$ atoms/cm$^3$ by controlling the total thickness of the first and second insulating films (elements 11 and 12 in FIG. 3 and 21 and 22 in FIG. 4) and the ion implanting energy. Thus, it is possible to make the concentration of impurities of the part of the base region which is under the interface of the emitter region 3 and the insulating layer 2 larger than $10^{17}$ atoms/cm$^3$, so that it is difficult to change the conductivity of this part from p-type to n-type. Furthermore, the distance between the emitter region and the collector region along the interface 5 (FIGS. 3F and 4F) of the base region 4 and the insulating layer 2 is considerably longer than that of the bipolar transistor (FIG. 1B) produced by the prior art technique, so that it is more difficult to form an n-type channel at the interface 5 than in the prior art case. Therefore, it is possible to increase the breakdown voltage between the emitter and the collector, and to prevent a short circuit from occurring.

With respect to the frequency characteristic of a bipolar transistor, it is generally thought that the deeper the base-collector junction is, the worse the frequency characteristic becomes. In the case where the walled emitter type bipolar transistor is produced in accordance with the present invention, it is possible to make the depth of the portion of the base region which is under the emitter region the same as the depth of the base region of a bipolar transistor produced by the prior art technique. Accordingly, with respect to the so-called active base region which is beneath an emitter region, since the length, width, and depth of the active base region of the bipolar transistor produced by the present invention are almost the same as those of the active base region of the bipolar transistor produced by the prior art technique, the frequency characteristic of the bipolar transistor of the present invention is almost the same as that of the prior art bipolar transistor.

EXAMPLE

A semiconductor body 1 (FIG. 3A) was made of a p-type silicon substrate and an n-type epitaxial layer grown on the substrate. The silicon substrate had a thickness of 300 μm and a resistivity of 10 ohm·cm. The epitaxial layer had a thickness of 2 μm and a resistivity of 0.5 ohm·cm. The epitaxial layer of the semiconductor body 1 was selectively oxidized by heating it under an oxidizing atmosphere to form an insulating oxide ($SiO_2$) layer 2 having a thickness of 1 μm on the semiconductor body 1. A silicon nitride film 11 (FIG. 3B) having a thickness of 50 nm was formed, and then a phospho-silicate glass film 12 having a thickness of 200 nm was formed, by a chemical vapour deposition process. After the formation of a photo-resist 13 (FIG. 3C), both the phospho-silicate glass film 12 and silicon nitride film 11 were etched by a plasma etching process using a gaseous mixture of carbon tetrafluoride ($CF_4$) and oxygen ($O_2$). By using hydrofluoric acid, the phospho-silicate glass film 12 was slightly etched to make the glass film 12 smaller than the silicon nitride film 11. Boron ions were implanted into the semiconductor body 1 at an energy level of 100 keV in a dose of $2 \times 10^{14}$ atoms/cm$^2$ to form a p-type base region 4 (FIG. 3D). The deepest depth of the base-collector junction 14 was 600 nm and the shallowest depth of the junction 14 was 350 nm below both the silicon nitride film 11 and glass film 12. The films 11 and 12 were removed and then a silicon dioxide film 15 was formed by oxidizing the semiconductor body 1 at a temperature of 1000° C. This heat-treatment served as an annealing-treatment for the base region 4. After the formation of a hole 17 in the silicon dioxide film 15 (FIG. 3F), phosphorus ions were implanted into the semiconductor body 1 through the hole 17 at an energy level of 1000 keV a dosage of $4 \times 10^{15}$ atoms/cm$^2$ to form an emitter region 3 (FIG. 3F), which was in contact with the insulating layer 2. The depth of the emitter region 3 was 250 nm. After the formation of a hole for a base electrode in the silicon dioxide film 15, an emitter electrode 8, a base electrode 8', and a collector electrode (not illustrated) made of aluminum were formed to produce a walled emitter type bipolar transistor, as illustrated in FIG. 3G.

It was found that the breakdown voltage between the emitter and the collector of the produced bipolar transistor was $15 \pm 5$ V. This value is three times as large as that of a walled emitter type bipolar transistor produced by the prior art technique.

It will be obvious that the present invention is not restricted to the embodiments and example described. For example, it is possible to exchange the conductivity type of the silicon substrate, epitaxial layer and implanted impurities from n-type to p-type or p-type to n-type. A so-called buried layer may be formed prior to the epitaxial growth.

Figure 5:
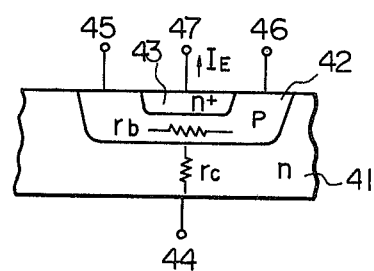
FIGS. 5, 6, 7A-7F, 8A-8I, 9A-9E, and 10A-10E illustrate respectively the structure, logic circuit and methods of making a four terminal type bipolar transistor.

Furthermore, as a kind of bipolar transistor, there is a four terminal type bipolar transistor in which the resistivity of a base region can be controlled. Such a four terminal type bipolar transistor having an npn structure is illustrated in FIG. 5 in a schematic sectional view. The bipolar transistor consists of an n-type collector region 41, a p-type base region 42, an n+-type emitter region 43, a collector terminal 44, a first base terminal 45, a second base terminal 46 and an emitter terminal 47.

When a voltage is applied between the collector terminal 44 and the emitter terminal 47 to cause a current $I_E$, the voltage drop generated by the resistance $r_c$ of the n-type collector region 41 decreases a reverse biased voltage between the collector region and the base region and increases a forward biased voltage between the base region and the emitter region. As a result, a depletion layer in the base region 42 becomes thinner and the area of base region 42 becomes a wider. Furthermore, holes, of which the number is the same as that of the electrons injected from the n+-type emitter region 43 into the base region 42, are generated in the emitter region 43 to increase electric conductivities of the emitter and base regions. The above-mentioned phenomena, caused by the flow of the current $I_E$, result in a decrease of the resistance $r_b$ of the base region 42 laying under the emitter region 43. Accordingly, it is possible to control the resistance $r_b$ between the first and second base terminals 45 and 46 by the current $I_E$. For example, it is possible to use the four terminal type bipolar transistor in a logic circuit, which is "on" when the current $I_E$ flows and which is "off" when the current $I_E$ does not flow.

Figure 6:
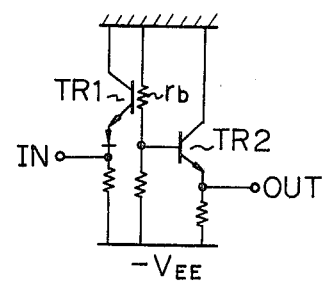

An example of a logic circuit using the four terminal type bipolar transistor is illustrated in FIG. 6. In FIG. 6 the symbols "TR$_1$," $r_b$," "TR$_2$," "IN," "OUT" and "$-V_{EE}$" represent the four terminal type bipolar transistor, the resistance of a base region of the transistor "TR$_1$," a conventional bipolar transistor, an input terminal, an output terminal and a source voltage, respectively. When a low level input signal "8" is applied to the input terminal IN, a current flows between a collector terminal and an emitter terminal of the transistor TR$_1$ to decrease the resistance $r_b$ of the transistor TR$_1$, so that the base voltage of the transistor TR$_2$ is heightened. Accordingly, a high level output signal "1" is available at the output terminal OUT. When a high level input signal "1" is applied at the input terminal IN, an emitter voltage of the transistor TR$_1$ is increased, so that the current does not flow between the collector terminal and the base terminal of the transistor TR$_1$ to increase the resistance $r_b$. As a result, the base voltage of the transistor TR$_2$ is lowered so that a low level output signal "0" is available at the output terminal OUT. The logic circuit operates as an inverter in the above-mentioned example.

The four terminal type bipolar transistor has been produced in the following manner.

Figure 7A:
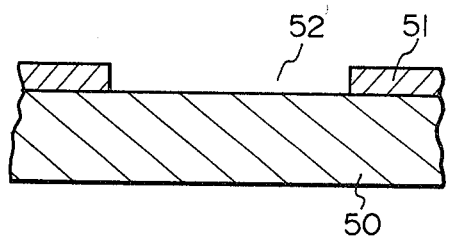

First, as illustrated in FIG. 7A, a silicon dioxide (SiO$_2$) film 51 is formed on an n-type silicon single-crystalline substrate (i.e. a collector region) 50, and then a window 52 is formed in the silicon dioxide film 51 at a position corresponding to a base region.

Figure 7B:
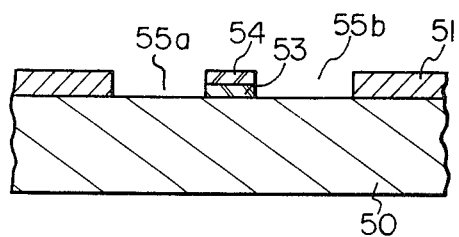

A silicon nitride (Si$_3$N$_4$) film 53 and another silicon dioxide film 54 are formed on the film 51 and the exposed substrate 50 by a conventional chemical vapour deposition process, and then are selectively removed by utilizing a conventional photo-lithography process to open windows 55a and 55b, as illustrated in FIG. 7B.

Figure 7C:
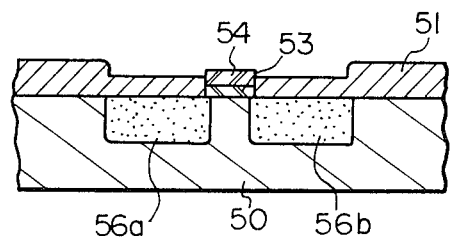

Then, p-type impurities are introduced into the substrate 50 through the windows 55a and 55b by a conventional impurity diffusion process to form two p-type base regions 56a and 56b, as illustrated in FIG. 7C. During or after the impurity diffusion process, the silicon dioxide film 51 is reformed on the exposed substrate 50.

Figure 7D:
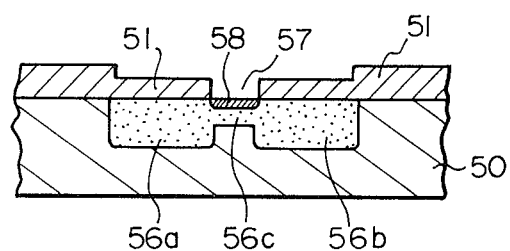

The silicon dioxide film 54 and the silicon nitride film 53 are removed by etching to open a window 57 as shown in FIG. 7D. P-type impurities are introduced through the window 57 by the impurity diffusion process to form a base region 56c, so that the base regions 56a, 56b, and 56c are combined into one base region, as illustrated in FIG. 7D. The concentration of p-type impurities at the surface of the base region 56c is usually approximately $10^{16}$ atoms/cm$^3$. Following the introduction of p-type impurities, n-type impurities are introduced by the impurity diffusion process to form an n+-type emitter region 58 (FIG. 7D) in the base region.

Figure 7E:
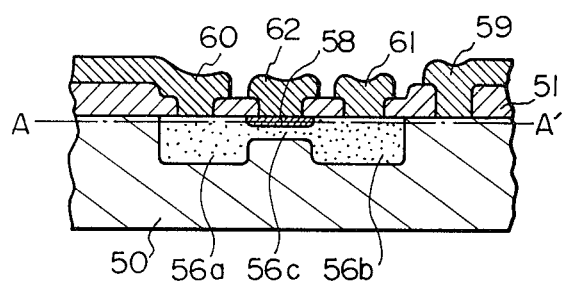
Figure 7F:
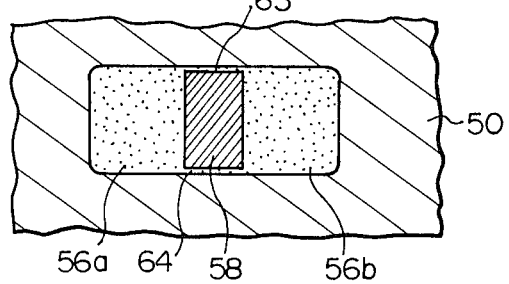

Finally, the silicon dioxide film 51 is selectively removed to open windows for contacting terminals and a collector terminal 59, a first base terminal 60, a second base terminal 61, and an emitter terminal 62 are formed by a conventionally suitable process, as illustrated in FIG. 7E, to produce the four terminal type bipolar transistor. The emitter region 58 must be disposed within the combined base region 55a, 55b, and 55c, as illustrated in FIG. 7F. FIG. 7F is a schematic sectional view taken along a line A—A' in FIG. 7E. If the emitter region 58 comes into contact with the collector region of the substrate 50, the function as a bipolar transistor cannot be performed. Accordingly, narrow areas 63 and 64 of base region are established between the collector region 50 and the emitter region 58 formed at the middle of the base region. However, because of these narrow areas 63 and 64, the transistor has the disadvantages that leak current may occur and the breakdown voltage between the collector region and the emitter region may drop. The transistor has also other disadvantages in that there is a limit in its ability to maintain the "off" condition, and it is difficult to increase the resistance $r_b$.

It is possible to improve the four terminal type bipolar transistor so as to eliminate the above-mentioned disadvantages. Three kinds of improved four terminal type bipolar transistors are illustrated in schematic sectional views in FIGS. 8I, 9E, and 10D.

The first improved four terminal type bipolar transistor is produced in the following manner.

Figure 8A:
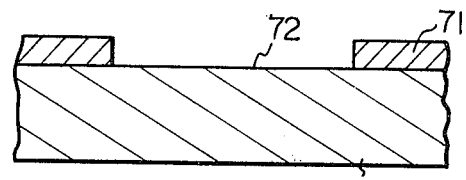

As illustrated in FIG. 8A, an n-type silicon substrate 70 is thermal-oxidized to form a silicon dioxide film 71 on it, and then the silicon dioxide film 71 is selectively removed by the photo-lithography process to open a window 72 at a position corresponding to a base region.

Figure 8B:
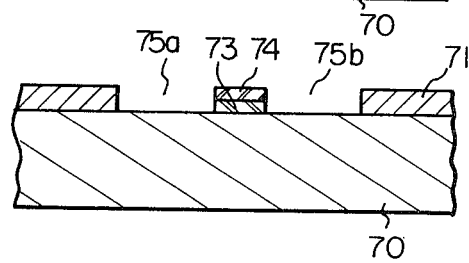
Figure 8C:
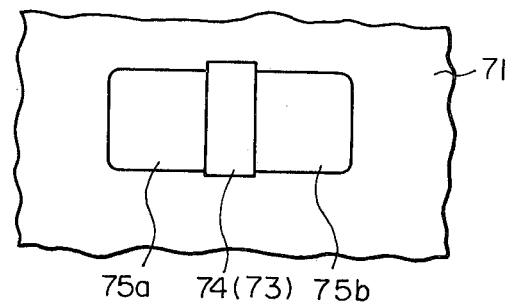

A silicon nitride film 73 and another silicon dioxide film 74 are deposited on the film 71 and the exposed substrate 70 by the chemical vapour deposition process, and then are selectively removed by the photo-lithography process to open windows 75a and 75b and to leave the silicon nitride film 73 and the silicon dioxide film 74 in the middle of the window 72, as illustrated in FIG. 8B. It is preferable to put the end portions of the films 73 and 74 on the silicon dioxide film 71, as illustrated in FIG. 8C. FIG. 8C is a schematic plan view of FIG. 8B.

Figure 8D:
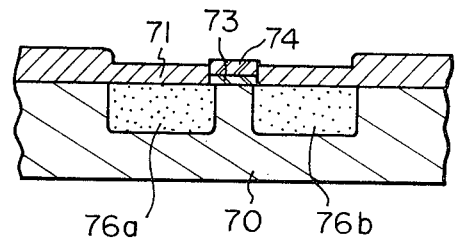

Then, p-type impurities are introduced into the substrate 70 through the windows 75a and 75b by the impurity diffusion process to form two p-type base region 76a and 76b; simultaneously the silicon dioxide film 71 is reformed in the windows 75a and 75b, as illustrated in FIG. 8D.

Figure 8E:
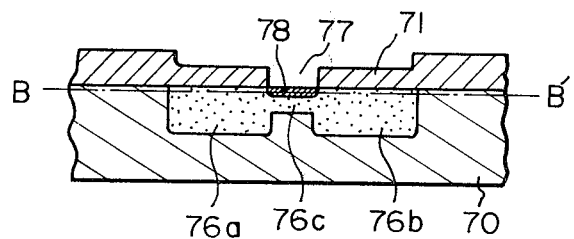
Figure 8F:
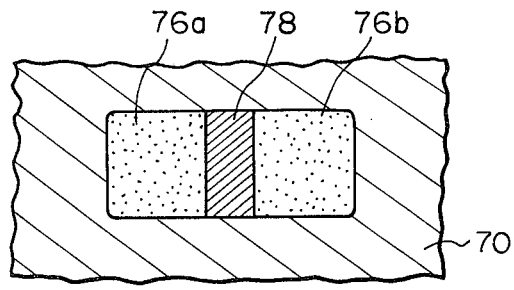

The silicon dioxide film 74 and the silicon nitride film 73 are removed by a wet etching process or a dry etching process (e.g. a plasma etching process) to open a window 77 (FIG. 8E). In the case of the wet etching, the silicon dioxide film 74 is etched with a hydrofluoric acid solution and the silicon nitride film 73 is etched with a phosphoric acid solution. P-type impurities are diffused into the substrate 70 through the window 77 to form a base region 76c having a depth of approximately 300 nm, and then n-type impurities are also diffused to form an emitter region 78 having a depth of approximately 100 nm, as illustrated in FIG. 8E. The emitter region 78 formed at the middle of the base region is in contact with the collector region (i.e. the substrate) 70, as illustrated in FIG. 8F. FIG. 8F is a schematic sectional view taken along a line B—B' in FIG. 8E.

Figure 8G:
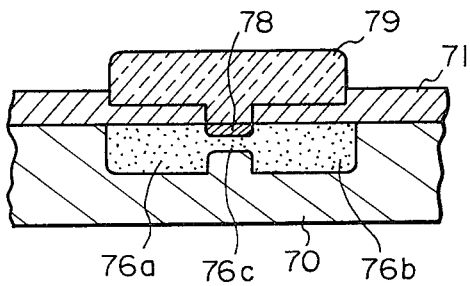
Figure 8H:
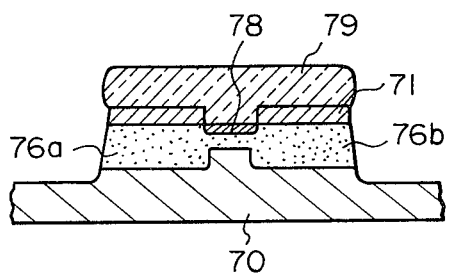

A photoresist film 79 is selectively formed on the emitter region 78 and portions of the silicon dioxide film 71, which lie on the combined base region 76a, 76b and 76c, by a conventional photolithography process, as illustrated in FIG. 8G. Since the photoresist film 79 serves as a protecting mask, it is possible to form a mesa-shaped portion of which the side surfaces comprise the side surfaces of the combined base region 76a, 76b and 76c and of the emitter region 78 by selectively removing the silicon dioxide film 71 and the silicon substrate 70 by a wet or dry etching process, as illustrated in FIG. 8H.

Figure 8I:
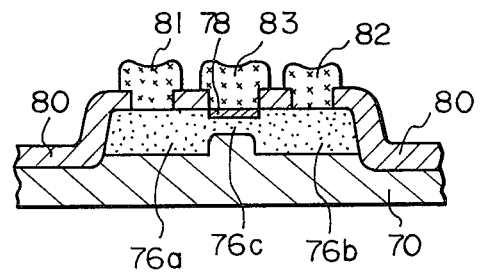

The photoresist film 79 is removed and then the entire exposed surfaces are thermal-oxidized to form a silicon dioxide film 80, as illustrated in FIG. 8I. Finally, the silicon dioxide films 71 and 80 are selectively removed to open windows for contacting terminals and a first base terminal 81, a second base terminal 82, an emitter terminal 83 and a collector terminal (not illustrated) are formed by the conventionally suitable process, as illustrated in FIG. 8I.

In the case where a four terminal type bipolar transistor is produced in the above-mentioned manner, since the combined base region 76a, 76b, and 76c constructs the mesa-shaped portion, the emitter region 78 cannot come into contact with the collector region (i.e. the substrate) 70. Therefore, the above-mentioned leak current and drop in the breakdown voltage do not occur.

The second improved four terminal type bipolar transistor is produced in the following manner.

Figure 9A:
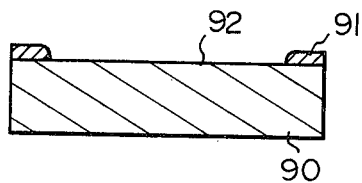

As illustrated in FIG. 9A, a silicon dioxide film 91 is formed on an n-type silicon substrate (a collector region) 90, and then is selectively removed by the photo-lithography process to open a window 92 at a position corresponding to a base region.

Figure 9B:
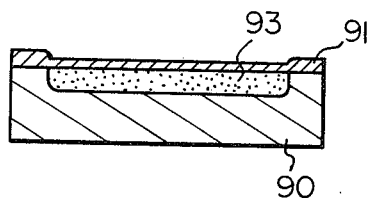

P-type impurities are introduced into the substrate 90 through the window 92 by a conventional impurity diffusion process or ion implantation process to form the base region 93 having a depth of approximately 100 nm, as illustrated in FIG. 9B. During after the introduction of impurities, the silicon dioxide film 91 is reformed on the base region 93.

Figure 9C:
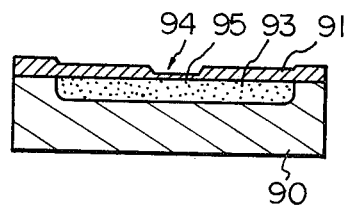

The reformed silicon dioxide film 91 is selectively removed by the photo-lithography process to open a window 94 (FIG. 9C). An insulating film 95 having a thickness of 40 ~ 100 nm is formed within the window 94, as illustrated in FIG. 9C. The insulating film 95 is either a silicon dioxide film formed by thermal-oxidizing the substrate 90 or a silicon nitride or silicon dioxide film formed by the chemical vapour deposition process.

Figure 9D:
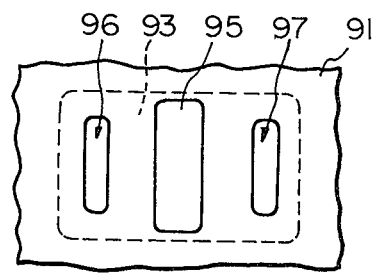

Then, the reformed silicon dioxide film 91 is selectively removed by the photo-lithography process to open the other windows 96 and 97 for contacting terminals, as illustrated in a plan view of FIG. 9D.

Figure 9E:
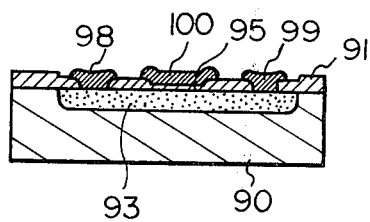

Finally, a metal film is deposited on the entire surfaces of the silicon dioxide film 91 and the exposed portions of the base region 93 in the windows 96 and 97 and is selectively removed by the photo-lithography process to form a first base terminal 98 and a second base terminal 99, an emitter terminal 100, and a collector terminal (not illustrated), as illustrated in FIG. 9E.

In the case of the four terminal type bipolar transistor produced in the above-mentioned manner, when a voltage is applied between the emitter terminal 100 and the substrate (i.e. the collector region) 90 causing electric current to flow, electrons are introduced in the base region 93 by the tunnel effect to decrease the resistance of the base region 93. Thus, it is possible to control the resistance $r_b$ between the first and second base terminals 98 and 99. Since a diffused emitter region is not formed in the bipolar transistor, the generation of an undesirable leak current and the drop of the breakdown voltage do not occur. Accordingly, the bipolar transistor has a higher reliability as compared with that of the conventional four terminal type bipolar transistor.

The third improved four terminal type bipolar transistor is produced in the following manner.

Figure 10A:
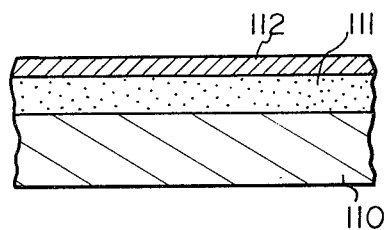

An epitaxial layer 111 (FIG. 10A) having a concentration of $10^{14} \sim 10^{16}$ atoms/cm$^3$ of p-type doped impurities nd serving as a base region is epitaxially grown on an n-type silicon substrate 110 by a conventional vapour growth deposition process under a reduced pressure.

The epitaxial layer 11 is thermal-oxidized to form a silicon dioxide film 112 on it. Since pressure in a reaction tube arranged in a furnace is reduced to 10~200 Torr during the vapour growth deposition process, it is possible to considerably lessen auto-doping of impurities from the substrate 110 into the epitaxial layer 111, so that a clear junction face between the substrate 110 and the epitaxial layer 111 can be obtained.

Figure 10B:
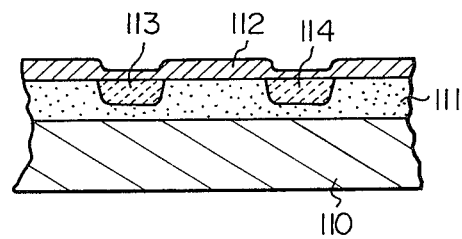

P-type impurities are diffused into the epitaxial layer 111 through two windows, which are opened in the silicon dioxide film 112 by the photo-lithography process, to form a first base contacting region 113 and a second base contacting region 114 having a concentration of impurities of approximately $10^{19}$ atoms/cm$^3$, as illustrated in FIG. 10B.

Figure 10C:
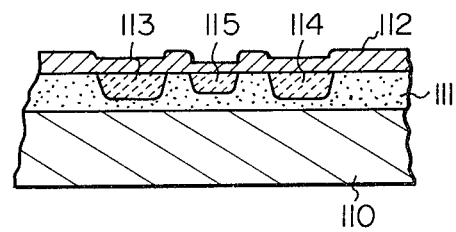

Then, n-type impurities are diffused into the epitaxial layer 111 through another window, which is opened in the silicon dioxide film 111 between the two windows, to form an emitter region 115, as illustrated in FIG. 10C.

Figure 10D:
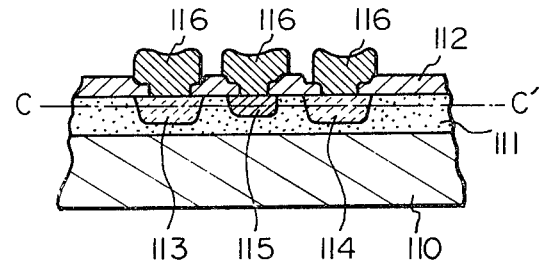

Contacting terminals 116 are formed on the first base contacting region 113 and the second base contacting region 114 and the emitter region 115, as illustrated in FIG. 10D.

Figure 10E:
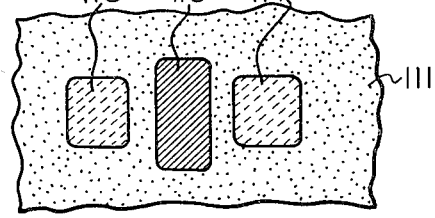

Since the emitter region 115 is made larger than the contacting base regions 113 and 114, as illustrated in FIG. 10E, which is a schematic sectional view taken along a line C—C' in FIG. 10D, the distance of the course from the first contacting base region 113 to the second contacting base region 114 around the emitter region 115 is longer than that of the conventional four terminal type bipolar transistor. Thus, it is difficult for a leak current to flow in the course, as compared with the conventional bipolar transistor. Furthermore, since the base region comprises the epitaxial layer having a high resistance caused by a low concentration of impurities in itself, the generation of an undesirable leak current and the drop of the breakdown voltage do not occur.

What is claimed is:

1. A method for producing, on a semiconductor body of a first conductivity type, a bipolar transistor which is isolated by an insulating layer and which has an emitter region that is in contact with said insulating layer and a base region, comprising the steps of:
   forming a first insulating film on a part of the semiconductor body and a part of said insulating layer prior to the formation of the base region;
   forming a second insulating film, which is smaller than said first insulating film, on said first insulating film above a part of said semiconductor body corresponding to said emitter region; and
   forming the base region by an ion implantation process.

2. A method for producing, on a semiconductor body of a first conductivity type, a bipolar transistor which is isolated by an insulating layer and which has an emitter region that is in contact with said insulating layer and a base region, comprising the steps of:
   selectively forming said insulating layer on the semiconductor body;
   forming a first insulating film on a part of said semiconductor body and a part of said insulating layer;
   forming a second insulating film, which is smaller than said first insulating film, on said first insulating film above a part of said semiconductor body corresponding to an emitter region;
   implanting impurities of a second conductivity type opposite to the first conductivity type into said semiconductor body by an ion implantation process to form the base region;
   removing said first and second insulating films; and
   introducing impurities of said first conductivity type into the part of said semiconductor body which is exposed by said removal of said first and second insulating films to form said emitter region.

3. A method for producing, on a semiconductor body of a first conductivity type, a bipolar transistor which is isolated by an insulating layer and which has an emitter region that is in contact with said insulating layer and a base region, comprising the steps of:
   selectively forming a first insulating film on the semiconductor body;
   forming a second insulating film, which is smaller than said first insulating film, on said first insulating film;
   selectively oxidizing said semiconductor body to form said insulating layer;
   removing parts of said first and second insulating films, so that the remaining portion of said first insulating film covers a part of said insulating layer and a part of said semiconductor body, and the remaining portion of said second insulating film is above a part of said semiconductor body corresponding to said emitter region;
   implanting impurities of a second conductivity type opposite to the first conductivity type into said semiconductor body by an ion implantation method to form the base region;
   removing said first and second insulating films; and
   introducing impurities of said first conductivity type into the part of said semiconductor body which is exposed by said removal of said first and second insulating films to form the emitter region.

4. A method according to claims 1, 2, or 3 wherein said insulating layer comprises silicon dioxide.

5. A method according to claim 1, 2, or 3 wherein said first insulating film is one selected from the group consisting of a silicon nitride film and a doublelayer film consisting of a silicon nitride upper film and a silicon dioxide lower film.

6. A method according to claim 1, 2, or 3 wherein said second insulating film comprises one selected from the group consisting of phospho-silicate glass, silicon dioxide, boron-silicate glass, alumino-silicate glass and amorphous-silicate glass.

7. A method according to claim 6 wherein said second insulating film comprises phospho-silicate glass.

8. A method according to claim 1, 2, or 3 wherein said first conductivity, type is one selected from the group consisting of an n-type and a p-type.

9. A method according to claim 8 wherein said first conductivity type is an n-type.

10. The process of claim 1, 2, or 3, further comprising the step of:
    forming a buried layer in the semiconductor body below the area where said base region is to be formed, prior to all other said forming steps.

11. The process of claim 10, wherein:
    said buried layer is of a conductivity type opposite to that of said base region.

12. The process of claim 11, further comprising the step of:
    forming a remote collector contact operatively connected to said buried layer.

13. The process of claim 12, further comprising the step of:

forming a collector contact region, of a conductivity type which is the same as that of said buried layer, in the semiconductor body, said collector contact region lying below said remote collector contact and above said buried layer and being connected therebetween, said step of forming a collector contact region being performed before said step of forming a remote collector contact and after said step of forming a buried layer.

14. The process of claim 1, 2, or 3, further comprising the step of:

forming a remote collector contact operatively connected to said semiconductor body.

15. The process of claim 1, 2, or 3, further comprising the step of:

providing an isolation region beneath said insulating layer, said isolation region being of a conductivity type opposite to that of said base region.

16. The process of claim 1, 2, or 3 wherein:

said first insulating film is formed to a thickness in the approximate range of 30 to 100 nanometers.

17. The process of claim 1, 2 or 3 wherein:

said second insulating film is formed to a thickness in the approximate range of 180 to 300 nanometers.

18. The process of claim 1, 2 or 3 wherein the step of forming said first insulating film further comprises:

forming a lower film of silicon dioxide, said lower film being formed to a thickness in the approximate range of 30 to 50 nanometers; and forming an upper film of silicon nitride, said upper film being formed to a thickness in the approximate range of 50 to 100 nanometers.

* * * * *

UNITED STATES PATENT AND TRADEMARK OFFICE
CERTIFICATE OF CORRECTION

PATENT NO. : 4,333,774

DATED : Jun. 8, 1982

INVENTOR(S) : Kamioka

It is certified that error appears in the above-identified patent and that said Letters Patent is hereby corrected as shown below:

Front page, [57] Abstract, line 5,
  "obtained" should be --resulting--; "a" should be --the--;
  line 6, "a" should be --the--.
Column 2, line 21, "is" first occurrence should be -- in --..
  line 42, delete "the occurence of".
Column 3, line 17, "a" should be --the--;
  line 37, "wall" should be --walled--.
Column 4, line 24, "to" should be --so--;
  line 29, delete "by" (first occurrence).
Column 5, line 27, after "nm" insert --,--;
  line 56, after "terraced" insert --,--.
Column 6, line 11, after "$cm^3$" insert --,--.
Column 7, line 54, delete "a";
  line 62, "laying" should be --lying--.
Column 8, line 8, "8" should be --0--.
Column 10, line 26, after "During" insert --or--.
Column 11, line 1, "11" should be --111--.
Column 12, line 46, "boron-silicate" should be --boro-silicate--;
  line 51, delete ",".

Signed and Sealed this

Twelfth Day of October 1982

[SEAL]

Attest:

GERALD J. MOSSINGHOFF

Attesting Officer  Commissioner of Patents and Trademarks